(12) United States Patent
Zimmermann

(10) Patent No.: US 8,328,406 B2
(45) Date of Patent: Dec. 11, 2012

(54) LOW-PROFILE ILLUMINATION DEVICE

(75) Inventor: Micha Zimmermann, Haifa (IL)

(73) Assignee: Oree, Inc., Ramat Gan (IL)

( * ) Notice: Subject to any disclaimer, the term of this patent is extended or adjusted under 35 U.S.C. 154(b) by 254 days.

(21) Appl. No.: 12/778,772

(22) Filed: May 12, 2010

(65) Prior Publication Data

US 2010/0315817 A1 Dec. 16, 2010

Related U.S. Application Data

(60) Provisional application No. 61/177,834, filed on May 13, 2009.

(51) Int. Cl.
*F21V 7/04* (2006.01)

(52) U.S. Cl. ............... 362/616; 362/97.3; 362/612

(58) Field of Classification Search .......... 362/616, 362/613, 612
See application file for complete search history.

(56) References Cited

U.S. PATENT DOCUMENTS

| | | | |
|---|---|---|---|
| 3,261,356 A | 7/1966 | Wallace |
| 3,626,471 A | 12/1971 | Florin |
| 3,871,747 A | 3/1975 | Andrews |
| 3,995,934 A | 12/1976 | Nath et al. |
| 4,551,129 A | 11/1985 | Coleman et al. |
| 4,669,467 A | 6/1987 | Willett et al. |
| 4,714,983 A | 12/1987 | Lang |
| 4,762,381 A | 8/1988 | Uemiya et al. |
| 4,783,140 A | 11/1988 | Osawa et al. |
| 4,829,192 A | 5/1989 | Kokubu et al. |
| 4,853,593 A | 8/1989 | Stein |
| 4,872,837 A | 10/1989 | Issalene et al. |
| 4,878,072 A | 10/1989 | Reinten |
| 4,903,172 A | 2/1990 | Schoniger et al. |
| 4,906,062 A | 3/1990 | Young |
| 5,048,913 A | 9/1991 | Glenn et al. |
| 5,061,032 A | 10/1991 | Meltz et al. |
| 5,139,420 A | 8/1992 | Walker |
| 5,152,686 A | 10/1992 | Duggan et al. |
| 5,165,187 A | 11/1992 | Shahidi-Hamedani et al. |
| 5,211,467 A | 5/1993 | Seder |
| 5,281,134 A | 1/1994 | Schultz |
| 5,425,730 A | 6/1995 | Luloh |
| 5,535,105 A | 7/1996 | Koenen et al. |
| 5,559,358 A | 9/1996 | Burns et al. |

(Continued)

FOREIGN PATENT DOCUMENTS

CN 2593229 12/2003

(Continued)

OTHER PUBLICATIONS

Allen et al., "A nearly ideal phosphor-converted white light-emitting diode" *Appl. Phys. Ltrs.* 92: 143309 (2008).

(Continued)

*Primary Examiner* — Evan Dzierzynski
(74) *Attorney, Agent, or Firm* — Bingham McCutchen LLP

(57) ABSTRACT

An illumination system in accordance with an embodiment hereof includes a first substantially flat waveguide for propagating and emitting light. The first waveguide may include a plurality of optical elements increasing in density from an edge to the center of the first waveguide. Light enters the first waveguide at the edge, and light is emitted from the top surface of the first waveguide. The intensity of the emitted light is substantially uniform over the top surface.

16 Claims, 3 Drawing Sheets

U.S. PATENT DOCUMENTS

| | | | |
|---|---|---|---|
| 5,569,254 A | 10/1996 | Carlson et al. | |
| 5,580,154 A | 12/1996 | Coulter et al. | |
| 5,675,678 A | 10/1997 | Neuberger et al. | |
| 5,718,666 A | 2/1998 | Alarcon | |
| 5,813,752 A | 9/1998 | Singer et al. | |
| 5,813,753 A | 9/1998 | Vriens et al. | |
| 5,847,507 A | 12/1998 | Butterworth et al. | |
| 5,899,552 A | 5/1999 | Yokoyama et al. | |
| 5,947,588 A | 9/1999 | Huang | |
| 5,959,316 A | 9/1999 | Lowery | |
| 5,969,869 A | 10/1999 | Hirai et al. | |
| 6,016,038 A | 1/2000 | Mueller et al. | |
| 6,031,511 A | 2/2000 | DeLuca et al. | |
| 6,079,838 A | 6/2000 | Parker et al. | |
| 6,097,871 A | 8/2000 | De Dobbelaere et al. | |
| 6,155,699 A | 12/2000 | Miller et al. | |
| 6,226,440 B1 | 5/2001 | Lyons | |
| 6,275,512 B1 | 8/2001 | Fermann | |
| 6,278,106 B1 | 8/2001 | Muto et al. | |
| 6,322,225 B1 | 11/2001 | Koike et al. | |
| 6,329,444 B1 | 12/2001 | McGlothlin et al. | |
| 6,345,903 B1 | 2/2002 | Koike et al. | |
| 6,350,041 B1 | 2/2002 | Tarsa et al. | |
| 6,351,069 B1 | 2/2002 | Lowery et al. | |
| 6,356,691 B2 | 3/2002 | Seong-jin et al. | |
| 6,408,123 B1 | 6/2002 | Kuroda et al. | |
| 6,417,616 B2 | 7/2002 | Lee | |
| 6,473,554 B1 | 10/2002 | Pelka et al. | |
| 6,488,704 B1 | 12/2002 | Connelly et al. | |
| 6,491,443 B1 | 12/2002 | Serizawa et al. | |
| 6,501,100 B1 | 12/2002 | Srivastava et al. | |
| 6,501,102 B2 | 12/2002 | Mueller-Mach et al. | |
| 6,504,301 B1 | 1/2003 | Lowery | |
| 6,522,065 B1 | 2/2003 | Srivastava et al. | |
| 6,527,419 B1 | 3/2003 | Galli | |
| 6,528,755 B2 | 3/2003 | Grewell et al. | |
| 6,530,670 B2 | 3/2003 | Hirayama et al. | |
| 6,549,709 B1 | 4/2003 | De Dobbelaere et al. | |
| 6,551,346 B2 | 4/2003 | Crossley | |
| 6,554,462 B2 | 4/2003 | Hulse et al. | |
| 6,599,000 B2 | 7/2003 | Nolan et al. | |
| 6,608,332 B2 | 8/2003 | Shimizu et al. | |
| 6,614,179 B1 | 9/2003 | Shimizu et al. | |
| 6,621,211 B1 | 9/2003 | Srivastava et al. | |
| 6,635,363 B1 | 10/2003 | Duclos et al. | |
| 6,635,987 B1 | 10/2003 | Wojnarowski et al. | |
| 6,637,924 B2 | 10/2003 | Pelka et al. | |
| 6,671,235 B1 | 12/2003 | Hawryluk et al. | |
| 6,680,004 B2 | 1/2004 | Ono et al. | |
| 6,687,010 B1 | 2/2004 | Horii et al. | |
| 6,694,069 B2 | 2/2004 | Kaneko et al. | |
| 6,709,132 B2 | 3/2004 | Ishibashi | |
| 6,714,711 B1 | 3/2004 | Lieberman et al. | |
| 6,754,408 B2 | 6/2004 | Toda et al. | |
| 6,765,237 B1 | 7/2004 | Doxsee et al. | |
| 6,796,698 B2 | 9/2004 | Sommers et al. | |
| 6,817,735 B2 | 11/2004 | Shimizu et al. | |
| 6,847,170 B2 | 1/2005 | Kayser | |
| 6,850,665 B2 | 2/2005 | Grubsky et al. | |
| 6,853,131 B2 | 2/2005 | Srivastava et al. | |
| 6,871,982 B2 | 3/2005 | Holman et al. | |
| 6,890,234 B2 | 5/2005 | Bortscheller et al. | |
| 6,908,205 B2 | 6/2005 | Greiner | |
| 6,917,057 B2 | 7/2005 | Stokes et al. | |
| 6,939,481 B2 | 9/2005 | Srivastava et al. | |
| 6,941,069 B2 | 9/2005 | Kaneko et al. | |
| 6,943,380 B2 | 9/2005 | Ota et al. | |
| 6,948,829 B2 | 9/2005 | Verdes et al. | |
| 6,965,709 B1 | 11/2005 | Weiss | |
| 6,982,522 B2 | 1/2006 | Omoto et al. | |
| 7,005,086 B2 | 2/2006 | Matsuno et al. | |
| 7,006,306 B2 | 2/2006 | Falicoff et al. | |
| 7,008,078 B2 | 3/2006 | Shimizu et al. | |
| 7,015,510 B2 | 3/2006 | Srivastava et al. | |
| 7,026,756 B2 | 4/2006 | Shimizu et al. | |
| 7,038,246 B2 | 5/2006 | Uemura | |
| 7,045,826 B2 | 5/2006 | Kim et al. | |
| 7,052,152 B2 | 5/2006 | Harbers et al. | |
| 7,066,623 B2 | 6/2006 | Lee et al. | |
| 7,071,616 B2 | 7/2006 | Shimizu et al. | |
| 7,086,767 B2 | 8/2006 | Sidwell et al. | |
| 7,123,796 B2 | 10/2006 | Steckl et al. | |
| 7,144,131 B2 | 12/2006 | Rains | |
| 7,153,008 B2 | 12/2006 | Grote, III et al. | |
| 7,178,941 B2 | 2/2007 | Roberge et al. | |
| 7,193,248 B2 | 3/2007 | Weindorf et al. | |
| 7,204,607 B2 | 4/2007 | Yano et al. | |
| 7,215,086 B2 | 5/2007 | Maxik | |
| 7,218,824 B2 | 5/2007 | Franklin et al. | |
| 7,221,110 B2 | 5/2007 | Sears et al. | |
| 7,230,222 B2 | 6/2007 | Cheng et al. | |
| 7,251,389 B2 | 7/2007 | Lu et al. | |
| 7,259,403 B2 | 8/2007 | Shimizu et al. | |
| 7,267,787 B2 | 9/2007 | Dong et al. | |
| 7,279,832 B2 | 10/2007 | Thurk et al. | |
| 7,288,797 B2 | 10/2007 | Deguchi et al. | |
| 7,293,906 B2 | 11/2007 | Mok et al. | |
| 7,331,700 B2 | 2/2008 | Zhang | |
| 7,345,317 B2 | 3/2008 | Reeh et al. | |
| 7,347,586 B2 | 3/2008 | Izardel | |
| 7,350,936 B2 | 4/2008 | Ducharme et al. | |
| 7,367,692 B2 | 5/2008 | Maxik | |
| 7,375,381 B2 | 5/2008 | Shimizu et al. | |
| 7,378,686 B2 * | 5/2008 | Beeson et al. | 257/100 |
| 7,382,091 B2 | 6/2008 | Chen et al. | |
| 7,391,060 B2 | 6/2008 | Oshio | |
| 7,396,142 B2 | 7/2008 | Laizure, Jr. et al. | |
| 7,399,108 B2 | 7/2008 | Ayabe et al. | |
| 7,425,798 B2 | 9/2008 | St.-Germain | |
| 7,430,355 B2 | 9/2008 | Heikenfeld et al. | |
| 7,433,565 B2 | 10/2008 | Joseph et al. | |
| 7,479,733 B2 | 1/2009 | Chang et al. | |
| 7,481,562 B2 | 1/2009 | Chua et al. | |
| 7,513,669 B2 | 4/2009 | Chua et al. | |
| 7,540,628 B2 | 6/2009 | Awai et al. | |
| 7,597,470 B2 | 10/2009 | Kurihara et al. | |
| 7,607,815 B2 | 10/2009 | Pang | |
| 7,635,203 B2 | 12/2009 | Weaver, Jr. et al. | |
| 7,638,754 B2 | 12/2009 | Morimoto et al. | |
| 7,639,916 B2 | 12/2009 | Fine | |
| 7,661,841 B2 | 2/2010 | Kurihara et al. | |
| 7,717,589 B2 | 5/2010 | Nishioka et al. | |
| 7,719,022 B2 | 5/2010 | Maeda et al. | |
| 7,722,211 B2 | 5/2010 | Marra et al. | |
| 7,736,042 B2 | 6/2010 | Park, II et al. | |
| 7,736,044 B2 | 6/2010 | Chew et al. | |
| 7,738,054 B2 | 6/2010 | Okumura et al. | |
| 7,791,683 B2 | 9/2010 | Larson et al. | |
| 7,826,698 B1 | 11/2010 | Meir et al. | |
| 7,845,839 B2 | 12/2010 | Collier | |
| 7,891,852 B2 | 2/2011 | Pugh et al. | |
| 7,903,198 B2 | 3/2011 | Abe et al. | |
| 2001/0046142 A1 | 11/2001 | Van Santen et al. | |
| 2001/0053072 A1 | 12/2001 | Takemoto | |
| 2002/0118907 A1 | 8/2002 | Sugama et al. | |
| 2002/0122629 A1 | 9/2002 | Grubsky et al. | |
| 2003/0156425 A1 | 8/2003 | Turnbull et al. | |
| 2003/0198455 A1 | 10/2003 | Usami | |
| 2004/0012556 A1 | 1/2004 | Yong et al. | |
| 2004/0156182 A1 | 8/2004 | Hatjasalo et al. | |
| 2004/0196648 A1 | 10/2004 | Franklin et al. | |
| 2004/0246697 A1 | 12/2004 | Yamashita et al. | |
| 2004/0257352 A1 | 12/2004 | Naugler et al. | |
| 2005/0041424 A1 | 2/2005 | Ducharme | |
| 2005/0100288 A1 | 5/2005 | Chu | |
| 2005/0116667 A1 | 6/2005 | Mueller et al. | |
| 2005/0243243 A1 | 11/2005 | Koganezawa | |
| 2005/0258432 A1 | 11/2005 | Cho | |
| 2005/0265403 A1 | 12/2005 | Anderson et al. | |
| 2006/0001036 A1 | 1/2006 | Jacob et al. | |
| 2006/0001037 A1 | 1/2006 | Schardt et al. | |
| 2006/0002146 A1 | 1/2006 | Baba | |
| 2006/0008205 A1 | 1/2006 | Meir et al. | |
| 2006/0012286 A1 | 1/2006 | Cull et al. | |
| 2006/0092346 A1 | 5/2006 | Moon et al. | |
| 2006/0098434 A1 | 5/2006 | Liu et al. | |
| 2006/0131924 A1 | 6/2006 | Reck | |

| | | |
|---|---|---|
| 2006/0164840 A1 | 7/2006 | Song et al. |
| 2006/0170332 A1 | 8/2006 | Tamaki et al. |
| 2006/0193133 A1 | 8/2006 | Von Der Brelie |
| 2006/0203502 A1 | 9/2006 | Stevens et al. |
| 2006/0208670 A1 | 9/2006 | Chang et al. |
| 2006/0221610 A1 | 10/2006 | Chew et al. |
| 2006/0227085 A1 | 10/2006 | Boldt et al. |
| 2006/0262250 A1 | 11/2006 | Hobbs |
| 2006/0262564 A1* | 11/2006 | Baba .......................... 362/616 |
| 2006/0268537 A1 | 11/2006 | Kurihara et al. |
| 2006/0273337 A1 | 12/2006 | Han et al. |
| 2006/0290253 A1 | 12/2006 | Yeo et al. |
| 2007/0019439 A1 | 1/2007 | Yu et al. |
| 2007/0031097 A1 | 2/2007 | Heikenfeld et al. |
| 2007/0053208 A1 | 3/2007 | Justel et al. |
| 2007/0057626 A1 | 3/2007 | Kurihara et al. |
| 2007/0086211 A1 | 4/2007 | Beeson et al. |
| 2007/0103914 A1 | 5/2007 | McCaffrey |
| 2007/0133210 A1 | 6/2007 | Watson et al. |
| 2007/0133935 A1 | 6/2007 | Fine |
| 2007/0138966 A1 | 6/2007 | Marka et al. |
| 2007/0147089 A1* | 6/2007 | Lin et al. ..................... 362/616 |
| 2007/0187710 A1 | 8/2007 | Steen et al. |
| 2007/0188425 A1 | 8/2007 | Saccomanno |
| 2007/0274094 A1 | 11/2007 | Schultz et al. |
| 2007/0284600 A1 | 12/2007 | Shchekin et al. |
| 2007/0297179 A1 | 12/2007 | Leung et al. |
| 2008/0007541 A1 | 1/2008 | Eliasson et al. |
| 2008/0029720 A1 | 2/2008 | Li |
| 2008/0049445 A1 | 2/2008 | Harbers et al. |
| 2008/0055931 A1 | 3/2008 | Verstraete et al. |
| 2008/0061683 A1 | 3/2008 | Bertram |
| 2008/0094348 A1 | 4/2008 | Yin et al. |
| 2008/0122365 A1 | 5/2008 | Decius et al. |
| 2008/0129927 A1* | 6/2008 | Hamada et al. ............. 349/65 |
| 2008/0144333 A1 | 6/2008 | Gourlay |
| 2008/0151576 A1 | 6/2008 | Inditsky |
| 2008/0186736 A1 | 8/2008 | Rinko |
| 2008/0192458 A1 | 8/2008 | Li |
| 2008/0205080 A1 | 8/2008 | Erchak et al. |
| 2008/0212315 A1 | 9/2008 | Cornelissen et al. |
| 2008/0218993 A1 | 9/2008 | Li |
| 2008/0239749 A1 | 10/2008 | Saccomanno et al. |
| 2008/0251690 A1 | 10/2008 | Keiper et al. |
| 2008/0252571 A1 | 10/2008 | Hente et al. |
| 2008/0297644 A1 | 12/2008 | Farchtchian et al. |
| 2008/0305439 A1 | 12/2008 | Khan |
| 2008/0316605 A1 | 12/2008 | Hazell et al. |
| 2009/0001397 A1 | 1/2009 | Fine et al. |
| 2009/0002668 A1 | 1/2009 | Rohe et al. |
| 2009/0016060 A1 | 1/2009 | Nakao |
| 2009/0027588 A1 | 1/2009 | Medendorp, Jr. et al. |
| 2009/0046453 A1 | 2/2009 | Kramer |
| 2009/0046978 A1 | 2/2009 | Yasuda et al. |
| 2009/0051268 A1 | 2/2009 | You et al. |
| 2009/0052205 A1 | 2/2009 | Chen et al. |
| 2009/0059359 A1 | 3/2009 | Nahm et al. |
| 2009/0059553 A1 | 3/2009 | Lin |
| 2009/0067194 A1 | 3/2009 | Sanchez |
| 2009/0116801 A1 | 5/2009 | Fine |
| 2009/0129115 A1 | 5/2009 | Fine et al. |
| 2009/0141476 A1 | 6/2009 | Meir et al. |
| 2009/0151575 A1 | 6/2009 | Eisendrath |
| 2009/0161340 A1 | 6/2009 | Huang et al. |
| 2009/0161341 A1 | 6/2009 | Meir et al. |
| 2009/0161361 A1 | 6/2009 | Meir et al. |
| 2009/0161369 A1 | 6/2009 | Regev et al. |
| 2009/0161383 A1 | 6/2009 | Meir et al. |
| 2009/0162015 A1 | 6/2009 | Meir et al. |
| 2009/0168395 A1 | 7/2009 | Mrakovich et al. |
| 2009/0201955 A1 | 8/2009 | Weigl et al. |
| 2009/0212718 A1 | 8/2009 | Kawashima et al. |
| 2009/0225565 A1 | 9/2009 | Zimmermann et al. |
| 2009/0225566 A1 | 9/2009 | Zimmermann et al. |
| 2009/0236620 A1 | 9/2009 | Park et al. |
| 2009/0250714 A1 | 10/2009 | Yun et al. |
| 2009/0273918 A1 | 11/2009 | Falicoff et al. |
| 2009/0284177 A1 | 11/2009 | Pedersen |
| 2009/0290380 A1 | 11/2009 | Meir et al. |
| 2009/0303412 A1 | 12/2009 | Ake et al. |
| 2009/0310338 A1 | 12/2009 | Negley |
| 2009/0315015 A1 | 12/2009 | Shimizu et al. |
| 2009/0322251 A1 | 12/2009 | Hilgers |
| 2010/0002414 A1 | 1/2010 | Meir et al. |
| 2010/0008628 A1 | 1/2010 | Shani |
| 2010/0014822 A1 | 1/2010 | Fine |
| 2010/0033420 A1 | 2/2010 | Jheng |
| 2010/0045189 A1 | 2/2010 | Storch et al. |
| 2010/0046219 A1 | 2/2010 | Pijlman et al. |
| 2010/0060157 A1 | 3/2010 | Shi |
| 2010/0079841 A1 | 4/2010 | Levola |
| 2010/0098377 A1 | 4/2010 | Meir |
| 2010/0195306 A1 | 8/2010 | Helbing et al. |
| 2010/0201611 A1 | 8/2010 | Duong et al. |
| 2010/0208469 A1 | 8/2010 | Shani |
| 2010/0208470 A1 | 8/2010 | Shani et al. |
| 2010/0220484 A1 | 9/2010 | Shani |
| 2010/0320904 A1 | 12/2010 | Meir |
| 2011/0013415 A1 | 1/2011 | Meir et al. |

FOREIGN PATENT DOCUMENTS

| | | |
|---|---|---|
| CN | 1321344 | 6/2007 |
| DE | 1 995 2430 | 5/2001 |
| EP | 0911658 | 10/1998 |
| EP | 1 376 708 A | 1/2004 |
| EP | 1521503 A1 | 4/2005 |
| EP | 1776722 A2 | 4/2007 |
| EP | 1876385 A2 | 1/2008 |
| EP | 1901587 A2 | 3/2008 |
| EP | 1988752 A1 | 11/2008 |
| EP | 2018089 A2 | 1/2009 |
| GB | 512062 A | 8/1939 |
| GB | 2339318 A | 1/2000 |
| GB | 2 343 361 | 5/2000 |
| GB | 2 448 564 | 10/2008 |
| JP | 5-127158 | 5/1993 |
| JP | 10-247412 A | 9/1998 |
| JP | 2004-241282 | 8/2004 |
| JP | 2005-085718 | 3/2005 |
| KR | 09/0224279 | 3/2009 |
| WO | WO-96/23649 | 8/1996 |
| WO | WO-97/031219 | 8/1997 |
| WO | WO-99/12400 A1 | 3/1999 |
| WO | WO-01/82657 A1 | 11/2001 |
| WO | WO-02/095289 A1 | 11/2002 |
| WO | WO-03/050448 | 6/2003 |
| WO | WO-03/065201 A1 | 8/2003 |
| WO | WO-2004/017109 | 2/2004 |
| WO | WO-2004/034362 A2 | 4/2004 |
| WO | WO-2004/053531 | 6/2004 |
| WO | WO-2004/100275 A1 | 11/2004 |
| WO | WO-2005/096258 A1 | 10/2005 |
| WO | WO-2005/101070 A1 | 10/2005 |
| WO | WO-2006/131924 A | 12/2006 |
| WO | WO-2007/044472 A2 | 4/2007 |
| WO | WO-2007/055509 | 5/2007 |
| WO | WO-2007/071397 A1 | 6/2007 |
| WO | WO-2007/086657 | 8/2007 |
| WO | WO-2008/013097 A1 | 1/2008 |
| WO | WO-2008/035282 A1 | 3/2008 |
| WO | WO-2008/045311 | 4/2008 |
| WO | WO-2008/053063 A1 | 5/2008 |
| WO | WO-2008/059445 A2 | 5/2008 |
| WO | WO-2008/093267 A1 | 8/2008 |
| WO | WO-2008/146290 | 12/2008 |
| WO | WO-2008/148927 A1 | 12/2008 |
| WO | WO-2009/130637 | 10/2009 |
| WO | WO-2009/130637 A1 | 10/2009 |

OTHER PUBLICATIONS

Application Brief AB27 "For LCD Backlighting Luxeon DCC", Lumileds (2004).

Beeson et al., "61.5: LED-Based Light-Recycling Light Sources for Projection Displays," *SID Symp. Dig. of Tech. Papers*, 37(1): 1823-1826 (2006).

Fine, "Back Light Modular Unit (BLMu) for large LCD screens", SIL (2006).

International Search Report and Written Opinion for PCT/IL 08/01553, mailed Mar. 25, 2009.
International Search Report and Written Opinion for PCT/IL2006/000667, dated Jun. 10, 2008.
International Search Report for PCT/IL2003/01042, mailed Jul. 29, 2004.
International Search Report for PCT/IL2008/000730, mailed Nov. 25, 2008.
Jones-Bey, "High-Output LEDs: Solid-state lighting seeks a role in pictures," www.laserfocusworld.com/articles (May 21, 2009).
Smith-Gillespie, R., "LCD Backlighting Options and Design Considerations", SID Display Applications Tutorial (May 22, 2008).
Zwanenburg et al., "41.2: High efficiency LEDs for LCD Backlights," *SID 04 Digest*, p. 1222, ISSN/0004-0966X/04/3502-1222 (2004).

International Search Report and Written Opinion for PCT/IL2008/01554, dated May 19, 2009.
"Solid-State Lighting Research and Development: Multi-year Program Plan," U.S. Department of Energy, 162 pages (Mar. 2010).
ISR and WO for PCT/IL2009/000248, mailed Dec. 14, 2009 (25 pages).
Office Action in Israel Patent Application No. 169122, dated Dec. 22, 2008 (translation).
Tsao et al., "Solid-state lighting: an integrated human factors, technology and economic perspective," Proc. IEEE, pp. 1-18 (Aug. 2009).
International Search Report and Written Opinion for PCT/IB2010/052844, mailed Mar. 31, 2011 (11 pages).

* cited by examiner

LOW-PROFILE ILLUMINATION DEVICE

CROSS-REFERENCE TO RELATED APPLICATION

This application claims priority to and the benefit of U.S. Provisional Patent Application No. 61/177,834, filed on May 13, 2009, the entire disclosure of which is incorporated by reference herein.

FIELD OF THE INVENTION

In various embodiments, the present invention generally relates to illumination devices, and in particular to low-profile illumination devices based on discrete light sources.

BACKGROUND

Most household light fixtures utilize incandescent light bulbs, which contain an incandescent filament inside a glass enclosure. These conventional light sources are fragile and have limited lifetimes, due primarily to increasing vulnerability of the filament to breakage as it ages. In practice, typical incandescent light bulbs have a mean life of 500 to 4,000 hours.

Light-emitting diodes (LEDs) represent an attractive alternative light source. Solid-state LEDs consume less power than incandescent light bulbs and may have lifetimes in excess of 100,000 hours. Besides producing little heat and being energy-efficient, LEDs are smaller and less vulnerable to breakage or damage due to shock or vibration than incandescent bulbs. LED characteristics generally also do not change significantly with age.

Moreover, LEDs can be used to create luminaires having novel form factors incompatible with most incandescent bulbs. More widespread luminaire design efforts not constrained by traditional incandescent form limitations will increase adoption of LED-based lighting and reap the energy savings associated therewith.

SUMMARY

Embodiments of the present invention provide low-profile illumination systems based on discrete light sources such as LEDs. These systems may be used directly as sleek, decorative luminaires or serve as the basis for more elaborate luminaire designs. Illumination systems in accordance herewith are substantially flat and emit light of substantially uniform intensity over their top surfaces. The emitted light may be white or another color, and the illumination systems may incorporate a phosphor material for converting light emitted by an LED of one wavelength into light of another wavelength. The illumination systems may have any of a number of shapes, e.g., circular, quadrilateral, or polygonal, and may be suitable for wall- or ceiling mounted fixtures. The luminous efficacies of illumination systems in accordance with embodiments of the invention may be 90 lumens/watt or more.

In an aspect, embodiments of the invention feature an illumination structure including a first substantially flat waveguide for propagating and emitting light. The first waveguide includes a plurality of optical elements increasing in density from the edge to the center of the first waveguide. Light enters the first waveguide at the edge, and light is emitted from the top surface of the first waveguide. The intensity of the emitted light is substantially uniform over the top surface.

Embodiments of the invention may include one or more of the following features in any of a variety of combinations. The illumination structure may include a second substantially flat waveguide disposed beneath the first waveguide, thus defining an interface between the first and second waveguides. The second waveguide may include or consist essentially of an in-coupling region, and, surrounding the in-coupling region, a propagation region. The in-coupling region receives light from a discrete light source. The propagation region, which retains and spreads the light from the in-coupling region, may be substantially free of optical elements. The propagation region may terminate in an edge through which light is emitted. A perimeter reflector, which reflects light emerging from the edge of the propagation region of the second waveguide into the edge of the first waveguide, may surround the first and second waveguides. A portion of the light emitted by the discrete light source may propagated from the in-coupling region and/or the propagation region into the first waveguide through the interface. Alternatively, the propagation region may retain substantially all of the light until it is emitted at the edge of the propagation region; thus, substantially all of the light entering the first waveguide is reflected into it by a perimeter reflector surrounding the first and second waveguides.

The discrete light source may be embedded within the in-coupling region and/or may be a bare light-emitting diode die. A heat spreader may be disposed below the second waveguide. The interface may include or consist essentially of a reflector, e.g., a double-sided reflector. The indices of refraction of the first and second waveguides may be greater than the index of refraction of the interface. The first waveguide may include a phosphor material for converting light to a different wavelength. The optical elements may include or consist essentially of microlenses and/or scattering particles (which may include or consist essentially of a phosphor material). The top surface of the first waveguide may be substantially circular. The light emitted from the top surface of the first waveguide may be substantially white. The illumination device may be substantially sized and shaped like a MR16 lamp, and may include an electrical interface suitable for a socket for an MR15 lamp.

In another aspect, embodiments of the invention include a method of illumination. Light is emitted into a bottom waveguide and propagated to the edge of the bottom waveguide. The light is reflected at the edge into a top waveguide disposed over the bottom waveguide, and emitted from the top surface of the top waveguide. The intensity of the emitted light is substantially uniform over the top surface. Substantially all of the light entering the top waveguide from the bottom waveguide may enter from the edge of the bottom waveguide, or a portion of the light in the bottom waveguide may enter the top waveguide through an interface between the top and bottom waveguides.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and in some embodiments, ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
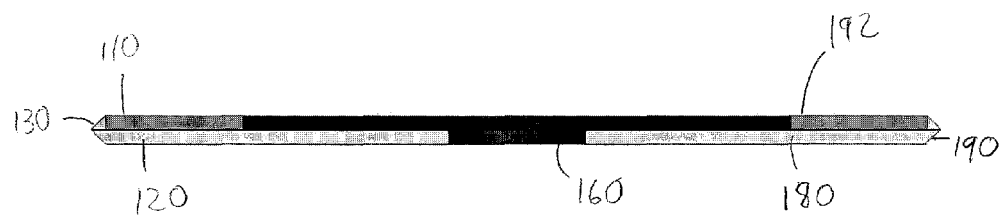
FIGS. 1A, 1B, and 1C are, respectively, a side view, a top view, and an exploded view of an exemplary illumination system in accordance with various embodiments of the invention.
Figure 1B:
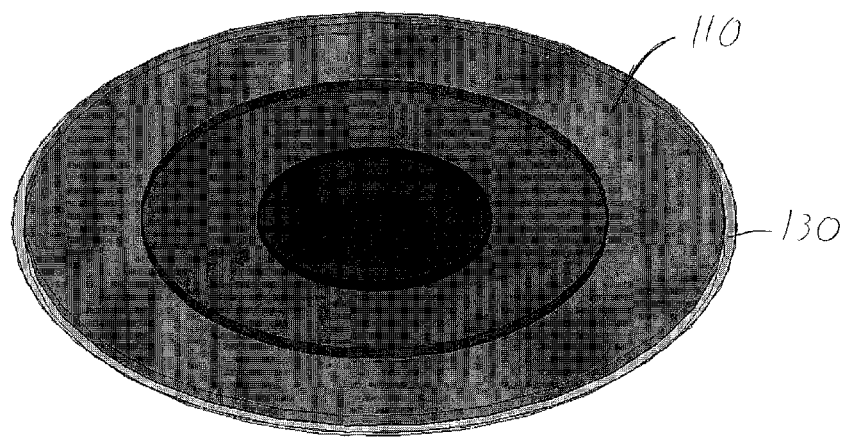
Figure 1C:
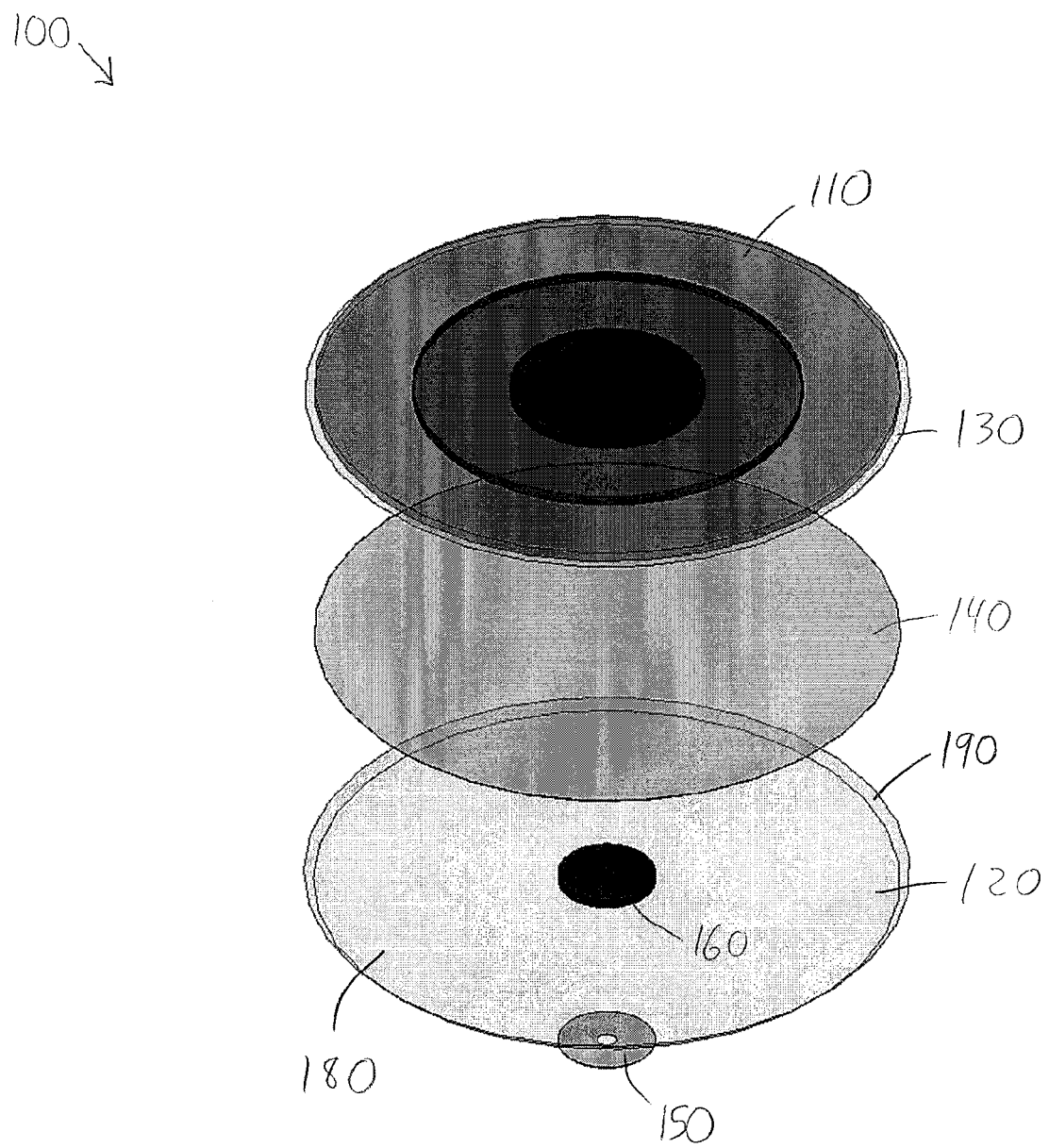
Figure 1D:
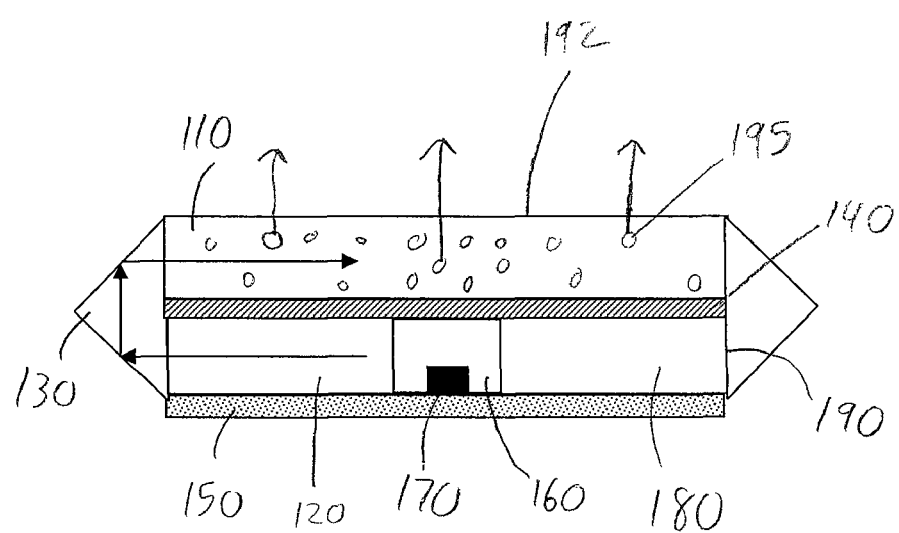
FIG. 1D is a schematic cross-sectional view of an exemplary illumination system in accordance with various embodiments of the invention.

Referring to FIGS. 1A-1D, an exemplary illumination system 100 includes a top waveguide 110, a bottom waveguide 120, a perimeter reflector 130, an interface 140, and a heat spreader 150. Bottom waveguide 120 includes an in-coupling region 160 for receiving light from a discrete light source 170, which may include or consist of, e.g., one or more LEDs. In a preferred embodiment, discrete light source 170 is embedded within in-coupling region 160. Bottom waveguide 120 also includes a propagation region 180 surrounding in-coupling region 160 for retaining and spreading light from in-coupling region 160 until it is emitted at an edge 190. Once emitted at edge 190, the light is reflected into top waveguide 110 by perimeter reflector 130. Top waveguide 110 propagates the light received from the bottom waveguide 120 and emits it from its top surface 192. An exemplary path traveled by light emitted from discrete light source 170 is shown in FIG. 1D as a series of arrows. Although illumination system 100 is depicted as circular in shape in FIGS. 1A-1C, illumination system 100 and its constituent components may have any of a variety of other shapes, including quadrilateral or polygonal. Regardless of the shape of illumination system 100, generally light is emitted from bottom waveguide 120 into top waveguide 110 at substantially the entire perimeter of illumination system 100, i.e., the entire outer edge 190. Any light in top waveguide 110 not emitted through top surface 192 may be "recycled" back into bottom waveguide 120 via reflection from perimeter reflector 130. Such recycled light will generally propagate back through bottom waveguide 120 and eventually be reflected back into top waveguide 110, although in some embodiments some of the recycled light may be absorbed by discrete light source 170 and therefore lost.

Top waveguide 110 and bottom waveguide 120 typically include or consist essentially of a waveguide material having a refractive index greater than 1. Representative examples of suitable waveguide materials include, without limitation, a thermoplastic such as a polycarbonate, polymethyl methacrylate (PMMA), and/or polyurethane (TPU) (aliphatic) with a refractive index of about 1.50, TPU (aromatic) with a refractive index of from about 1.58 to about 1.60, amorphous nylon such as GRILAMID supplied by EMS Grivory (e.g., GRILAMID TR90 with refractive index of about 1.54), polymethylpentene, e.g., TPX supplied by Mitsui with a refractive index of about 1.46, polyvinylidene fluoride (PVDF) with a refractive index of about 1.34, or other thermoplastic fluorocarbon polymers, and/or STYROLUX (UV stabilized) supplied by BASF with refractive index of about 1.58.

To facilitate emission of the light, top waveguide 110 includes a plurality of optical elements 195 within top waveguide 110 or disposed on its top surface. Optical elements 195 serve as scatterers and typically scatter light in more than one direction. When light is scattered by an optical element 195 such that the impinging angle is below the critical angle for internal reflection, no total internal reflection occurs and the scattered light is emitted through the top surface 192 of top waveguide 110. Additional details regarding optical elements, their function, and their placement may be found in U.S. Patent Application Publication Nos. 2009/0161341, 2009/0161369, and 2009/0161383, the entire disclosures of which are incorporated by reference herein.

Optical elements 195 may include or consist essentially of light-scattering particles such as, e.g., beads, glass beads, or other ceramic particles, rubber particles, silica particles, particles including or consisting essentially of inorganic materials such as $BaSO_4$ or $TiO_2$, particles including or consisting essentially of a phosphor material, and the like. In an embodiment, the light-scattering particles are substantially or even completely non-phosphorescent. Such non-phosphorescent particles merely scatter light without converting the wavelength of any of the light striking the particles. The term "optical elements" may also refer to non-solid objects embedded in the waveguide, provided that such objects are capable of scattering the light. Representative example of suitable non-solid objects include, without limitation, closed voids within the waveguide, e.g., air bubbles, and/or droplets of liquid embedded within the waveguide. The optical elements 195 may also be organic or biological particles, such as, but not limited to, liposomes. In some embodiments, optical elements such as microlenses are utilized in conjunction with, or even instead of, light-scattering particles. In other embodiments, optical elements include or consist essentially of structures such as hemispheres or diffusive dots.

In accordance with various embodiments of the invention, the size, type, and/or density of optical elements 195 is selected to provide illumination that is substantially uniform in intensity across top surface 192. For example, the density of optical elements 195 may increase from the edge of top waveguide 110 to the center of top waveguide 110; thus, the optical mean free path within top waveguide 110 may decrease as a function of distance from its edge to its center. The diminishing optical mean free path facilitates an increasing ratio between the emitted portion and propagated portions of the light. Although the density (and/or size and/or type) of optical elements 195 is illustrated in FIGS. 1A-1C as increasing in discrete steps (thus resulting in concentric areas containing different densities of optical elements 195), the increase in size, type, or density may be gradual. As it is generally meant to propagate light to its edge, propagation region 180 of bottom waveguide 120 may be substantially free of optical elements 195; thus, the optical mean free path within propagation region 180 may be substantially constant. In-coupling region 160 may include a plurality of optical elements 195 to facilitate coupling and redirecting the light emitted by discrete light source 170 into propagation region 180.

Perimeter reflector 130 may be, e.g., a specular mirror sized and shaped to direct light from bottom waveguide 120 into top waveguide 110. Although perimeter reflector 130 is depicted in FIG. 1D as having substantially straight sides meeting at a right angle, perimeter reflector may have other shapes, e.g., curved or parabolic.

As previously mentioned, discrete light source 170 may include or consist essentially of one or more LEDs, each of which includes the bare die and all the additional components packed in the LED package. More preferably, discrete light source 170 may include or consist essentially of the bare die, excluding one or more of the other components (e.g., reflecting cup, substrate, LED package, and the like). In preferred embodiments of the invention, bare LED dies do not include a phosphor or other photoluminescent material as a portion thereof (e.g., on a common substrate therewith or incorporated into or onto the LED semiconductor layer structure).

As used herein "bare die" refers to a p-n junction of a semiconductor material. When a forward bias is applied to the p-n junction through electrical contacts connected to the p side and the n side of the p-n junction, the p-n junction emits light with a characteristic spectrum. Thus, in various exemplary embodiments of the invention, discrete light source 170 includes or consists essentially of only the semiconductor p-n junction and the electrical contacts. Also contemplated are configurations in which several light sources are LEDs, and several light sources are bare dies with electrical contacts connected thereto.

One advantage of using a bare die rather than an LED is that some of the components in the LED package, including the LED package itself, may absorb part of the light emitted from the p-n junction and therefore reduce the light yield. Another advantage is that the use of a bare die reduces the amount of heat generated during light emission, because heat is generated via absorption of light by the LED package and reflecting cup. The consequent increase in temperature of the p-n junction causes a thermal imbalance that may reduce the light yield. Since the bare die does not include the LED package and reflecting cup, the embedding of a bare die in the waveguide reduces the overall amount of heat and increases the light yield. The elimination of the LED package permits the use of many small bare dies instead of large packaged LEDs. Such a configuration allows the operation of each bare die at low power while still producing a sufficient overall amount of light, thus improving the p-n junction efficacy.

Discrete light source 170 may include or consist essentially of multiple LEDs (or bare LED dies), each of which may emit substantially the same or a substantially different color. In the latter case, the light from each of the LEDs may mix within propagation region 180 to form light having a desired color gamut that is emitted from top surface 192. For example, discrete light source 170 may include or consist essentially of one or more red LEDs, one or more green LEDs, and one or more blue LEDs, and the light emitted from top surface 192 may be substantially white. Discrete light source 170 may also include one or more amber LEDs in such embodiments.

In various embodiments, at least a portion of the light emitted from discrete light source 170 is stimulated by a phosphor (or other photoluminescent) material disposed within top waveguide 110 or bottom waveguide 120. In some embodiments, the optical elements 195 incorporate the phosphor material, and in other embodiments, the phosphor material is present as a discrete layer or region through which the light propagates prior to being emitted from top surface 192. The phosphor material may even be present within a layer disposed directly on top of top surface 192 such that light emitted therefrom is converted as it passes through the layer. As used herein, the term "phosphor" refers to any material for converting at least a portion of the light from discrete light source 170 into a different color (i.e., changing its wavelength). For example, part of the light from a blue LED may be converted to yellow light, which mixes with the remaining blue light to provide white output illumination. Additional details regarding phosphor materials and their placement may be found in U.S. Patent Application Nos. 2009/0161341, 2009/0161369, 2009/0161383, 2009/0129115, 2009/0141476, and 2010/0002414, the entire disclosures of which are incorporated by reference herein.

Various embodiments of the present invention feature one or more phosphor materials disposed within illumination system 100 outside of the direct "line-of-sight" from discrete light source 170. That is, in such embodiments, there is no direct, straight-line optical path between the discrete light source 170 and the phosphor material; rather, light emitted from discrete light source 170 reflects from a reflector, a surface, or an interface within illumination system 100 before reaching the phosphor material. Thus, any light striking and being back-reflected from the phosphor material will not propagate directly back into discrete light source 170 (where it could be absorbed, thus reducing overall light output and efficiency of illumination system 100). Rather, light reflecting from the phosphor material will tend to remain within illumination system 100 and will eventually be emitted from top surface 192. In some embodiments, there is substantially no direct line-of-sight between discrete light source 170 and the phosphor material, i.e., less than approximately 5% of the light from discrete light source 170 has a direct line-of-sight to the phosphor material; any losses thereof are therefore negligible.

Whether or not the phosphor material is within a direct line-of-sight of discrete light source 170, the phosphor material may advantageously be located remotely in relation to discrete light source 170, i.e., it may be present in propagation region 180 or in top waveguide 110 rather than proximate discrete light source 170 (in in-coupling region 160, for example). The quantum efficiency (or other performance metric) of the phosphor material may degrade when the material is exposed to elevated temperatures, e.g., temperatures greater than approximately 50° C. Remote placement of the phosphor material prevents the temperature of the material from rising during operation due to, e.g., heat given off by discrete light source 170. Instead, the temperature of remotely placed phosphor material will generally remain at the ambient temperature of the surroundings of illumination system 100. Generally, the temperature of the phosphor material may remain at least approximately 30° C., or even up to approximately 100° C. less than the maximum temperature of discrete light source 170 during operation.

Heat spreader 150 is disposed beneath bottom waveguide 120 and includes or consists essentially of a thermally conductive material, e.g., a metal such as aluminum or copper. Heat spreader 150 conducts heat away from discrete light source 170 during operation thereof, and may be disposed beneath only in-coupling region 160 (as shown in FIG. 1C) or beneath substantially all of bottom waveguide 120 (as shown in FIG. 1D). Heat spreader 150 may also be substantially reflective, thus substantially preventing light emission from the bottom surface of bottom waveguide 120. As shown in FIG. 1C, heat spreader 150 may have one or more openings therethrough to facilitate electrical connection of discrete light source 170 to a source of electrical power.

Interface 140 may be a discrete "layer" or feature disposed between top waveguide 110 and bottom waveguide 120, or it may simply be the plane of contact between top waveguide 110 and bottom waveguide 120. Interface 140 may have an index of refraction lower than that of top waveguide 110 and/or bottom waveguide 120 in order to facilitate light confinement within the waveguides (and partially or substantially prevent propagation of such light through interface 140). Interface 140 may include or consist essentially of a mechanical structure forms an intentional air gap between top waveguide 110 and bottom waveguide 120, e.g., one or more mechanical spacers. Such an air gap (which may be on the micrometer scale), may also be formed by top waveguide 110 and bottom waveguide 120 being in mechanical contact but not optical contact (e.g., not having an index-matching material therebetween or not having optically smooth, mechanically matched opposing surfaces). In preferred embodiments, interface 140 is a reflector for at least the light within top waveguide 110. That is, light within top waveguide 110 reflects off of interface 140 and is emitted only through top surface 192. Regarding light within bottom waveguide 120, interface 140 may reflect substantially all of such light (thereby preventing emission of such light except at edge 190) or may allow a portion of such light to propagate therethrough, as detailed below.

In various embodiments, substantially all of the light in propagation region 180 is retained therein until it is emitted at edge 190 and reflected by perimeter reflector 130 into top waveguide 110. Thus, substantially all of the light entering top waveguide 110 is reflected therein by perimeter reflector 130. In such embodiments, interface 140 is impervious to light propagation therethrough, and may include or consist essentially of, e.g., a double-sided reflector. The double-sided reflector may simply include or consist essentially of a coating or foil of reflective material on the bottom surface of top waveguide 110 and the top surface of bottom waveguide 120. In various embodiments, the double-sided reflector includes or consists essentially of a discrete foil (e.g., a metallic or polymeric film) disposed between the waveguides that is reflective on both sides (e.g., is formed of a reflective material or has one disposed on both sides thereof). Suitable reflective materials include aluminum or VIKUITI Enhanced Specular Reflector (ESR) film, available from 3M Company of St. Paul, Minn., USA.

In other embodiments, a portion of the light in bottom waveguide 120, e.g., light in in-coupling region 160 and/or propagation region 180, propagates into top waveguide 110 directly through interface 140. The arrangement (and/or size or type) of optical elements 195 is generally adjusted to compensate for the fact that light enters top waveguide 110 both by reflecting from perimeter reflector 130 and by direct propagation through interface 140. In such embodiments, the interface 140 may include the above-described air gap and/or a partially transmissive coating on a discrete foil or film or on at least one of the opposing surfaces of the waveguides. The interface 140 and/or the waveguides 110, 120 may include features of and/or be based on structures of embodiments described in U.S. Pat. No. 7,639,916, the entire disclosure of which is incorporated by reference herein.

As mentioned above, the brightness (i.e., the intensity) of the illumination from top waveguide 110 may be substantially uniform. Brightness uniformity may be calculated by considering the luminance deviation across the range of azimuthal angles as a fraction of the average luminance across that range. A more simple definition of the brightness uniformity BU is BU=1−($L_{MAX}$−$L_{MIN}$)/($L_{MAX}$+$L_{MIN}$), where $L_{MAX}$ and $L_{MIN}$ are, respectively, the maximal and minimal luminance values across the predetermined range of azimuthal angles. The term "substantially uniform intensity" refers to a BU value which is at least 0.8 when calculated according to the above formula. In some embodiments of the invention the value of BU is at least 0.85, more preferably at least 0.9, and still more preferably at least 0.95.

The luminous efficacies of illumination systems 100 in accordance with embodiments of the invention may be 90 lumens/watt or more. Illumination system 100 may provide at least approximately 900 lumens of warm white with a high color-rendering index (CRI) while consuming less than approximately 10 watts of electric power. In various embodiments, illumination systems 100 may be substantially sized and shaped like an MR16 lamp, and may include electrical interface(s) to fit into sockets for MR16 lamps.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination structure comprising:
a first substantially flat waveguide for propagating and emitting light, the first waveguide comprising one or more optical elements for coupling light out of the first waveguide;
a second substantially flat waveguide disposed beneath the first waveguide and defining an interface therebetween, the second waveguide comprising (i) an in-coupling region for receiving light from a discrete light source and (ii) surrounding the in-coupling region, a propagation region for retaining therein and spreading therethrough light from the in-coupling region, the propagation region terminating in an edge through which light is emitted; and
a perimeter reflector surrounding the first and second waveguides, the perimeter reflector reflecting light emerging from the edge of the propagation region of the second waveguide into the edge of the first waveguide,
wherein (i) a first portion of light emitted by the discrete light source propagates from at least one of the in-coupling region or the propagation region into the first waveguide through the interface, (ii) a second portion of light emitted by the discrete light source is retained in the propagation region until emitted at the edge thereof, the perimeter reflector reflecting the second portion of the light into the first waveguide at an edge thereof, and (iii) light is emitted from a top surface of the first waveguide, an intensity of the emitted light being substantially uniform over the top surface.

2. The illumination structure of claim 1, wherein the discrete light source is embedded within the in-coupling region.

3. The illumination structure of claim 2, wherein the discrete light source is a bare light-emitting diode die.

4. The illumination structure of claim 1, further comprising a heat spreader disposed below the second waveguide.

5. The illumination structure of claim 1, wherein the interface comprises a partially transmissive coating on at least one of a discrete foil disposed at the interface, a discrete film disposed at the interface, a surface of the first waveguide facing the second waveguide, or a surface of the second waveguide facing the first waveguide.

6. The illumination structure of claim 1, wherein the interface comprises an air gag between the first and second waveguides.

7. The illumination structure of claim 1, wherein indices of refraction of the first and second waveguides are greater than an index of refraction of the interface.

8. The illumination structure of claim 1, wherein the first waveguide comprises a phosphor material for converting light to a different wavelength.

9. The illumination structure of claim 1, wherein the one or more optical elements comprise at least one of microlenses or scattering particles.

10. The illumination structure of claim 9, wherein the one or more optical elements comprise scattering particles, the scattering particles comprising a phosphor material.

11. The illumination structure of claim 1, wherein the top surface of the first waveguide is substantially circular.

12. The illumination structure of claim 1, wherein the light emitted from the top surface of the first waveguide is substantially white.

13. The illumination structure of claim 1, wherein the one or more optical elements comprise a plurality of optical elements increasing in density from the edge of the first waveguide to a center of the first waveguide.

14. A method of illumination, the method comprising:
   emitting light into a bottom waveguide;
   propagating a first portion of the light into a top waveguide disposed over the bottom Waveguide through an interface therebetween;
   propagating a second portion of the light to an edge of the bottom waveguide;
   reflecting the second portion of the light at the edge into the top waveguide; and
   emitting light from a top surface of the top waveguide, an intensity of the emitted light being substantially uniform over the top surface.

15. The method of claim 14, further comprising converting a wavelength of at least some of at least one of the first portion of light or the second portion of light to a different wavelength.

16. The method of claim 14, further comprising recycling at least some of at least one of the first portion of light or the second portion of light back into the bottom waveguide prior to emission thereof from the top surface of the top waveguide.

* * * * *